(12) United States Patent
McInnis

(10) Patent No.: US 6,300,828 B1
(45) Date of Patent: Oct. 9, 2001

(54) SWITCHLESS HIGH EFFICIENCY AMPLIFIER

(75) Inventor: A. J. McInnis, Santa Rosa, CA (US)

(73) Assignee: Next Level Communications, Rohnert Park, CA (US)

( * ) Notice: Subject to any disclaimer, the term of this patent is extended or adjusted under 35 U.S.C. 154(b) by 0 days.

(21) Appl. No.: 09/488,276

(22) Filed: Jan. 20, 2000

(51) Int. Cl.[7] ........................................... H03F 3/68
(52) U.S. Cl. ..................................... 330/124 R; 330/195
(58) Field of Search ............................. 330/124 R, 129, 330/165, 195, 51

(56) References Cited

U.S. PATENT DOCUMENTS

| | | |
|---|---|---|
| 3,471,798 | 10/1969 | Seidel et al. .......................... 330/151 |
| 4,701,716 | 10/1987 | Poole ...................................... 330/43 |
| 5,083,094 | 1/1992 | Forsberg ........................... 330/124 R |
| 5,136,256 | 8/1992 | Salzberg ................................. 330/53 |
| 5,218,317 | 6/1993 | Boulzaguet et al. ............. 330/124 R |
| 5,264,807 | 11/1993 | Okubo et al. .......................... 330/295 |
| 5,399,986 | 3/1995 | Yen ........................................ 330/84 |
| 5,420,541 | 5/1995 | Upton et al. .......................... 330/286 |
| 5,548,246 | * | 8/1996 | Yanamoto et al. ..................... 330/51 |
| 5,568,086 | 10/1996 | Schuss et al. ..................... 330/124 R |
| 5,712,591 | * | 1/1998 | Maag et al. ....................... 330/124 R |
| 5,872,481 | 2/1999 | Sevic et al. ............................. 330/51 |
| 6,133,788 | * | 10/2000 | Dent .................................. 330/124 R |

OTHER PUBLICATIONS

Low–Power ADSL Central–Office Line Driver, Texas Instruments, product preview, 1999, 6 pgs.

* cited by examiner

*Primary Examiner*—Steven J. Mottola
(74) *Attorney, Agent, or Firm*—Morrison & Foerster LLP (57) ABSTRACT

A high potential/high efficiency amplifier contains at least two separate amplifiers. One amplifier is used for the typical inputs that are received from an input source and a second amplifier is used solely for peak inputs. Utilizing the second amplifier to handle the peak inputs allows the first amplifier to concentrate solely on the typical inputs. A small resistor tied to the output of the second amplifier reduces the output of the second amplifier. Thus, when the output of the first and second amplifiers are equal, the output of the first amplifier will be applied to the load. When the input exceeds the operational value for the first amplifier, the first amplifier logically disconnects itself from the load and the output of the second amplifier is applied to the load. Once the input returns to a value within the limits of the first amplifier, the first amplifier becomes operational again, and the resistor again becomes a barrier to the second output being applied to the load.

44 Claims, 8 Drawing Sheets

SWITCHLESS HIGH EFFICIENCY AMPLIFIER

FIELD OF THE INVENTION

The present invention relates generally to a method and apparatus for providing a switchless high efficiency amplifier, and in particular, to a method and apparatus for providing an amplifier that switches between an amplifier that handles typical lower loads and an amplifier that handles the higher peak loads.

BACKGROUND OF THE INVENTION

As is well known, an amplifier is a device that receives an input and applies a defined gain in order to produce an output that is greater than the input. For example, a voltage amplifier may receive a 10V input and produce an output of 20V, if the voltage amplifier has a gain of two. Amplifiers are able to apply the gain to produce an output up to a certain value. For example, a voltage amplifier can produce an output up to a value of the operational voltage applied to the amplifier. That is, a voltage amplifier with an operational voltage of 15V and a gain of three can produce the desired output as long as the input does not exceed 5V. If the voltage amplifier receives an input voltage of 6V it would attempt to produce an output of 18V, which is above the maximum that this voltage amplifier can produce. Therefore, the voltage amplifier would not have the potential to drive the load to the desired voltage. Thus, when designing a device utilizing an amplifier, assurances should be made that the amplifier can handle the maximum input that will be received. That is, if the typical range of input voltages is 3–5V but a peak voltage of between 6–8V is possible, the amplifier should be capable of handling an 8V input.

Figures 1, 2:
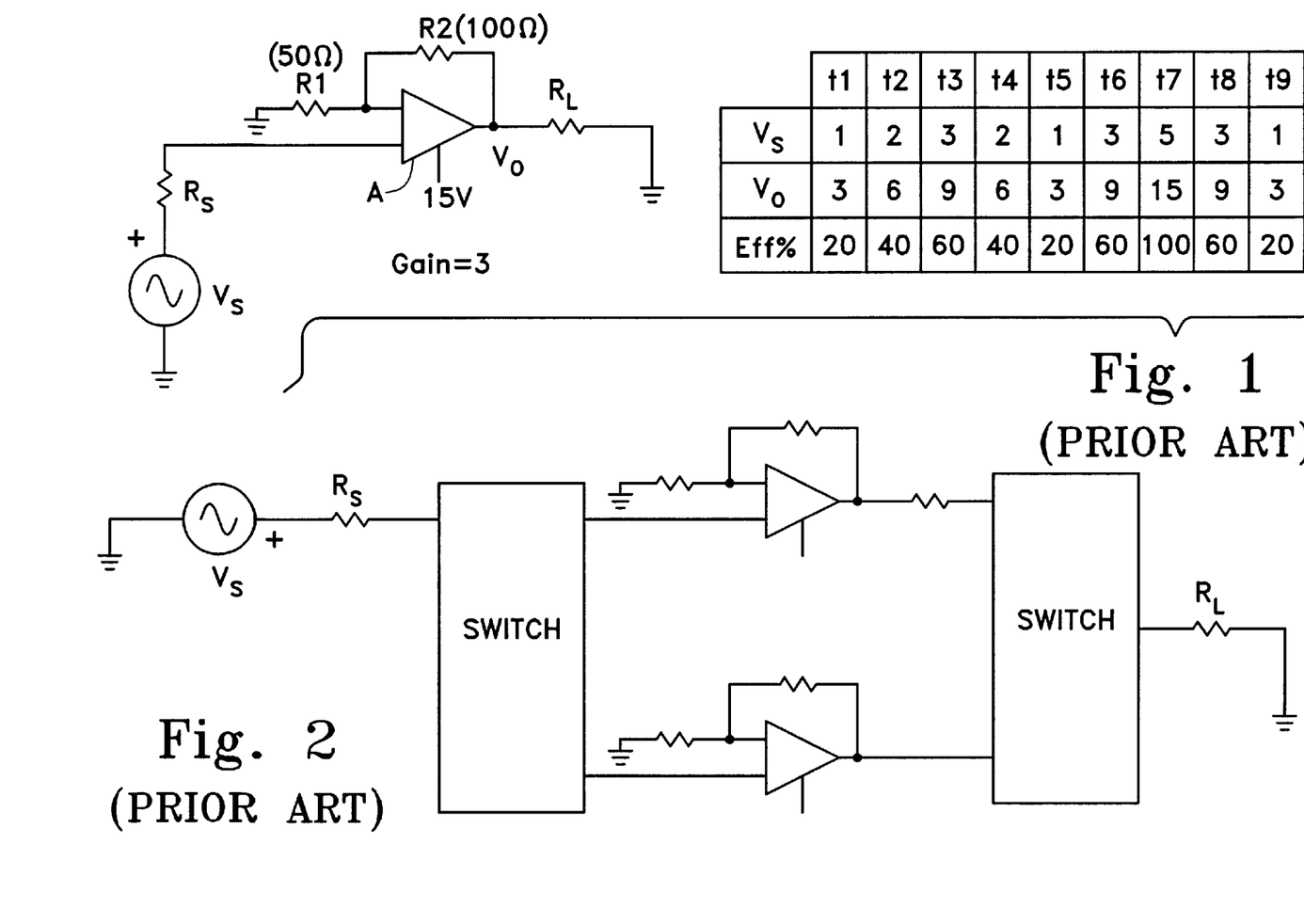
FIG. 1 illustrates a standard voltage amplifier design and the efficiency of the amplifier during typical inputs and peak inputs.
FIG. 2 illustrates a prior art dual voltage amplifier utilizing a complex switching mechanism to switch between the two amplifiers.

Amplifiers work best if they are producing outputs that are near the maximum output that the amplifier can handle. That is, a 15V amplifier works most efficiently when producing outputs around 15V. However, the typical outputs of a 15V amplifier are probably much lower since the 15V operating voltage (i.e., maximum output) was selected to handle peak input voltages. For example, the maximum input voltage (peak voltage) for a 15V amplifier with a gain of three is 5V, and a typical input voltage may be in the range of 1–3V. An example 15V amplifier is illustrated in FIG. 1. A voltage supply $V_s$ is connected to the amplifier A. The amplifier A is powered by an operational voltage of 15V. The gain of the amplifier A is three as defined by resistors R1 and R2. The output voltage $V_o$ of the amplifier A is applied to the load $R_L$. As the chart depicts the typical range of voltage inputs to the amplifier A from the voltage supply $V_s$ is between 1–3V so that the typical output voltage $V_o$ is between 3–9V. Therefore, the output voltage $V_o$ ranges between 20–60% of the peak output potential for the typical input. Thus, the amplifier A is typically very inefficient. FIG. 1 depicts the amplifier A receiving a peak voltage from the voltage source $V_s$ at time t7, at which time the amplifier A is at 100% efficiency. The amplifier A runs at peak efficiency only at the periods of time when peak input voltages are being received by the amplifier A.

Thus, an inherent problem associated with standard amplifiers is the conflict between the desirability of providing large output potentials and the undesirability of providing lower potentials through a large potential drop. One solution proposed is to provide separate amplifiers which each operate efficiently within a range. One amplifier would be designed to handle the typical inputs, while the other amplifier would be designed to handle the peak inputs. Switching between these two amplifiers would provide both efficiency and the capability of handling peak inputs. However, this type of dual amplifier has seldom been utilized because a complex switching means is required. For example, as illustrated in FIG. 2, a switching circuit would be required to receive the input voltage and make a determination of which of the two amplifiers the voltage should be applied to.

Thus, there is a need for an amplifier that provides high efficiency and high potential capability that does not require a complex switching mechanism.

SUMMARY OF THE INVENTION

The present invention relates to an amplifier that can handle peak inputs while maintaining high efficiency. To accomplish this, an amplifier is provided that contains at least two separate amplifiers. One amplifier is used for the typical inputs that are received from an input source and a second amplifier is used solely for peak inputs. Utilizing the second amplifier to handle the peak inputs allows the first amplifier to concentrate solely on the typical inputs. Thus, for example, the operating voltage of a first voltage amplifier can be reduced so that the output voltage is a large percentage of the operating voltage and is operating at close to peak efficiently. Instead of using complex switching devices to switch between the first voltage amplifier and the second voltage amplifier, a small resistor is placed between the output of the second voltage amplifier and the load. The resistor reduces the output voltage of the second voltage amplifier available to be applied to the load. Thus, when the output of the first voltage amplifier and the output of the second voltage amplifier are the same, the first voltage amplifier will provide current to the load since the voltage available to be applied to the load is greater for the first voltage amplifier. When the input voltage exceeds the operational value for the first voltage amplifier the first voltage amplifier is of such a type that it becomes reverse biased and logically disconnects itself from the load. When this happens, the resistance connected to the output of the second voltage amplifier does not reduce the output voltage enough to prevent current from flowing from the second voltage amplifier to the load. Once the input voltage returns to a value within the limits of the first voltage amplifier, the first voltage amplifier becomes operational again, and the resistor again becomes a barrier to current flowing from the second voltage amplifier to the load. Thus, the inventive amplifier provides a simple design for producing an amplifier with high efficiency and high potential capability.

BRIEF DESCRIPTION OF THE DRAWINGS

The accompanying drawings, which are incorporated in and form a part of the specification, illustrate the embodiments of the present invention and, together with the description serve to explain the principles of the invention.

In the drawings.

DETAILED DESCRIPTION OF PREFERRED EMBODIMENTS

In describing a preferred embodiment of the invention illustrated in the drawings, specific terminology will be used for the sake of clarity. However, the invention is not intended to be limited to the specific terms so selected, and it is to be understood that each specific term includes all technical equivalents that operate in a similar manner to accomplish a similar purpose.

Figure 3:
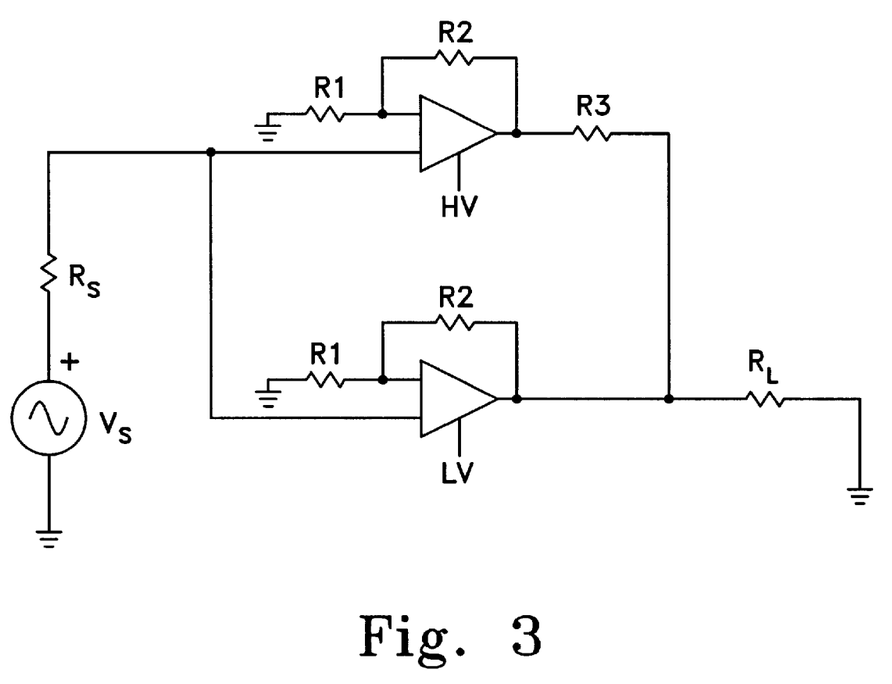
FIG. 3 illustrates a first embodiment of a switchless high efficiency voltage amplifier.

With reference to the drawings, in general, and FIGS. 3 through 8B in particular, a high efficiency, high potential amplifier is disclosed. FIG. 3 illustrates a first embodiment of a switchless high efficiency amplifier. The amplifier is illustrated as a voltage amplifier, but should not be construed as being limited to a voltage amplifier. As illustrated, a voltage supply $V_s$ has a negative terminal tied to ground and a positive terminal connected to a positive input terminal of both a low voltage amplifier LV and a high voltage amplifier HV through a supply resistor $R_s$. An output of the low voltage amplifier LV is connected directly to the load $R_L$ and an output of the high voltage amplifier HV is connected to the load $R_L$ through a resistive element R3, such as a resistor. The gain of both the low voltage amplifier LV and the high voltage amplifier HV is determined by the negative feedback of the amplifier which is defined by resistive elements R1 and R2, such as resistors. Since the input voltage and the gain for each of the amplifiers is identical, the output voltage of each amplifier will also be identical. The low voltage amplifier LV is provided with a low operating voltage and the high voltage amplifier is provided with a high operating voltage. Each of the amplifiers is capable of producing an output voltage up to the operating voltage of the amplifier.

Thus, as long as the input voltage is within a range that will produce an output voltage within the limits of the low voltage amplifier LV, the low voltage amplifier LV will provide the current I to the load $R_L$ since the voltage available from the low voltage amplifier LV it greater than the voltage available from the high voltage amplifier HV after it has been reduced by the resistive element R3. That is, resistive element R3 prevents the high voltage amplifier HV from supplying current I inefficiently while the low voltage amplifier LV is able to provide the desired output voltage. Once the input voltage exceeds a value that will produce an output voltage within the limits of the low voltage amplifier LV, the low voltage amplifier LV is of a type to become reverse biased and thus logically disconnect from the load $R_L$. When this happens, the resistive element R3 connected between the output of the high voltage amplifier HV and the load $R_L$ does not reduce the voltage enough to prevent current I from flowing from the high voltage amplifier HV to the load $R_L$. There will be a small loss in the gain across the resistive element R3, however since the resistive element R3 is small in comparison to the load $R_L$, the loss will be minimal. If the loss can not be tolerated, it can be compensated for by an opposing feedback. Compensating for loss with an opposing feedback is well known to those skilled in the art and therefore is not addressed in this application. Once the input voltage returns to a value within the limits of the low voltage amplifier LV, the low voltage amplifier LV becomes operational again, and the resistive element R3 again becomes a barrier to current I flowing from the high voltage amplifier HV to the load $R_L$.

Figure 4A:
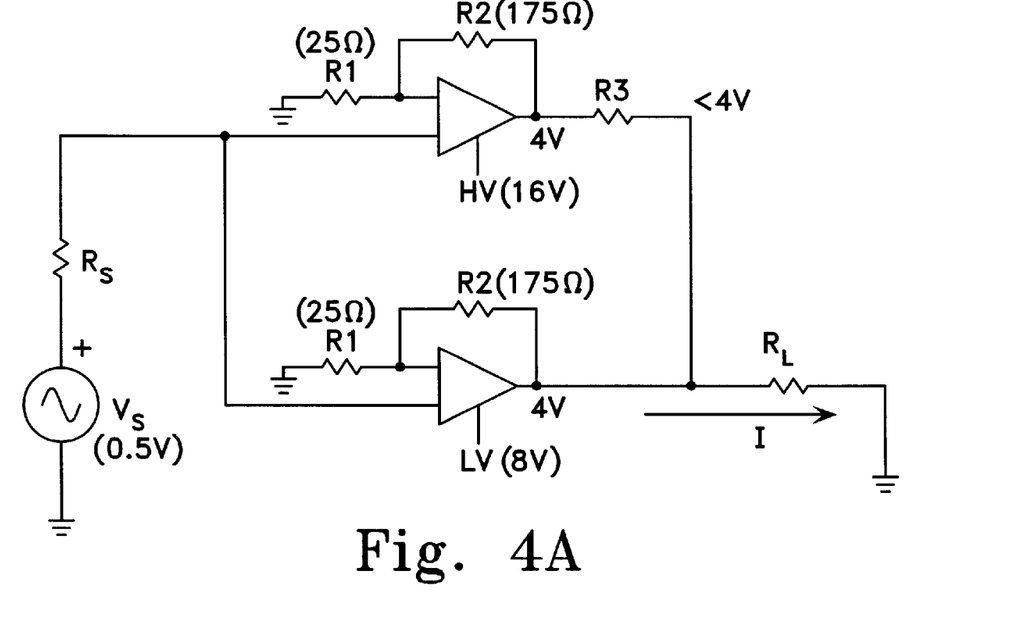
FIG. 4A illustrates the operation of the first embodiment of the switchless high efficiency voltage amplifier for typical inputs.
Figure 4B:
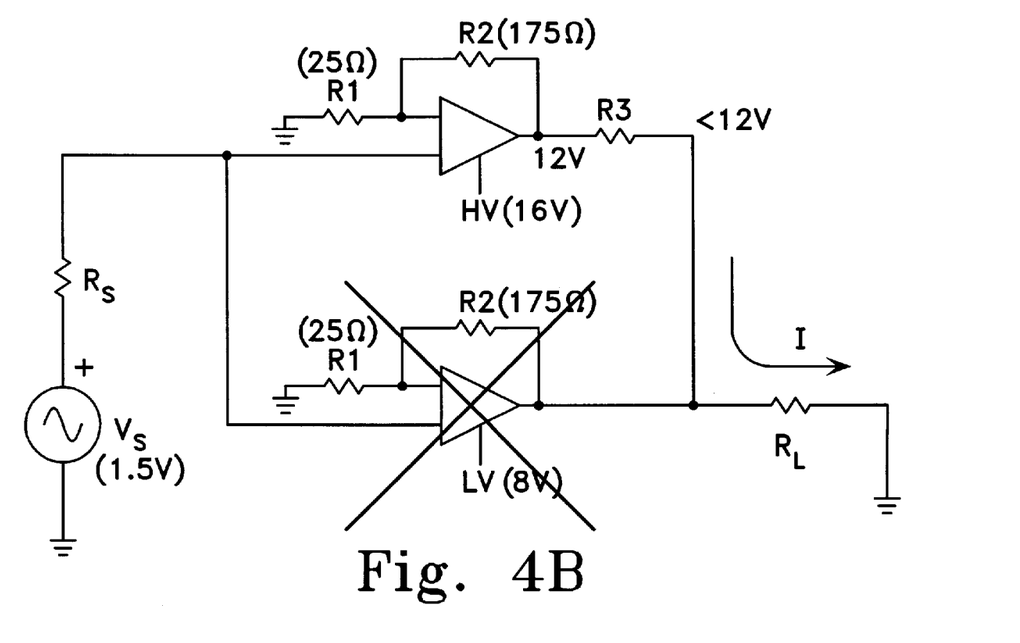
FIG. 4B illustrates the operation of the first embodiment of the switchless high efficiency voltage amplifier for peak inputs.

FIGS. 4A and 4B illustrates the amplifier of FIG. 3 operating for various input voltages with example gain and operating voltages assigned. FIG. 4A is the amplifier operating while the voltage supply $V_s$ is providing a voltage within a typical range, while FIG. 4B is the amplifier operating while the voltage supply $V_s$ is providing a peak voltage. For the illustrative example, the range of the voltage supply is from 0 to 2V with the typical range being from 0 to 1V and the peak range being from 1 to 2V. The gain is eight as defined by resistive elements R1 and R2. For example, to have a gain of eight, R2 may be 175Ω and R1 may be 25Ω. The low voltage amplifier LV is supplied with an operating voltage of 8V and the high voltage amplifier HV is provided with an operating voltage of 16V.

In FIG. 4A the voltage supply $V_s$ is supplying 0.5V to the input of each of the amplifiers. Thus, the output voltage of each amplifier is 4V, which is within the limits of both amplifiers. Since the output voltage of the high voltage amplifier HV is reduced by resistive element R3, it is less than the output voltage of the low voltage amplifier LV. Therefore, current I will flow to the load $R_L$ from the output voltage of the low voltage amplifier LV. However, as illustrated in FIG. 4B, if the input voltage from the voltage supply $V_s$ was a peak potential, for example 1.5V, the output voltage of the amplifiers would be 12V which is above the characteristics of the low voltage amplifier LV. Therefore, the low voltage amplifier LV would become reverse biased and logically disconnected from the load $R_L$. Since there is no voltage from the low voltage amplifier LV, current I will flow to the load $R_L$ from the high voltage amplifier HV even though the output voltage is slightly reduced by the resistive element R3. That is, resistive element R3 does not reduce the output voltage enough to prevent current I from flowing from the high voltage amplifier HV to the load $R_L$.

FIGS. 4A and 4B are simply examples and should not be construed as defining the scope of the invention. As those skilled in the art know, the operating voltages, the gain and the input voltage can vary greatly depending on the amplifier design and the circuit it is utilized in. Moreover, those skilled in the art should realize that these principles are not limited to voltage amplifiers. These principles could be applied to, for example, magnetic and fluid amplifiers.

Figure 5:
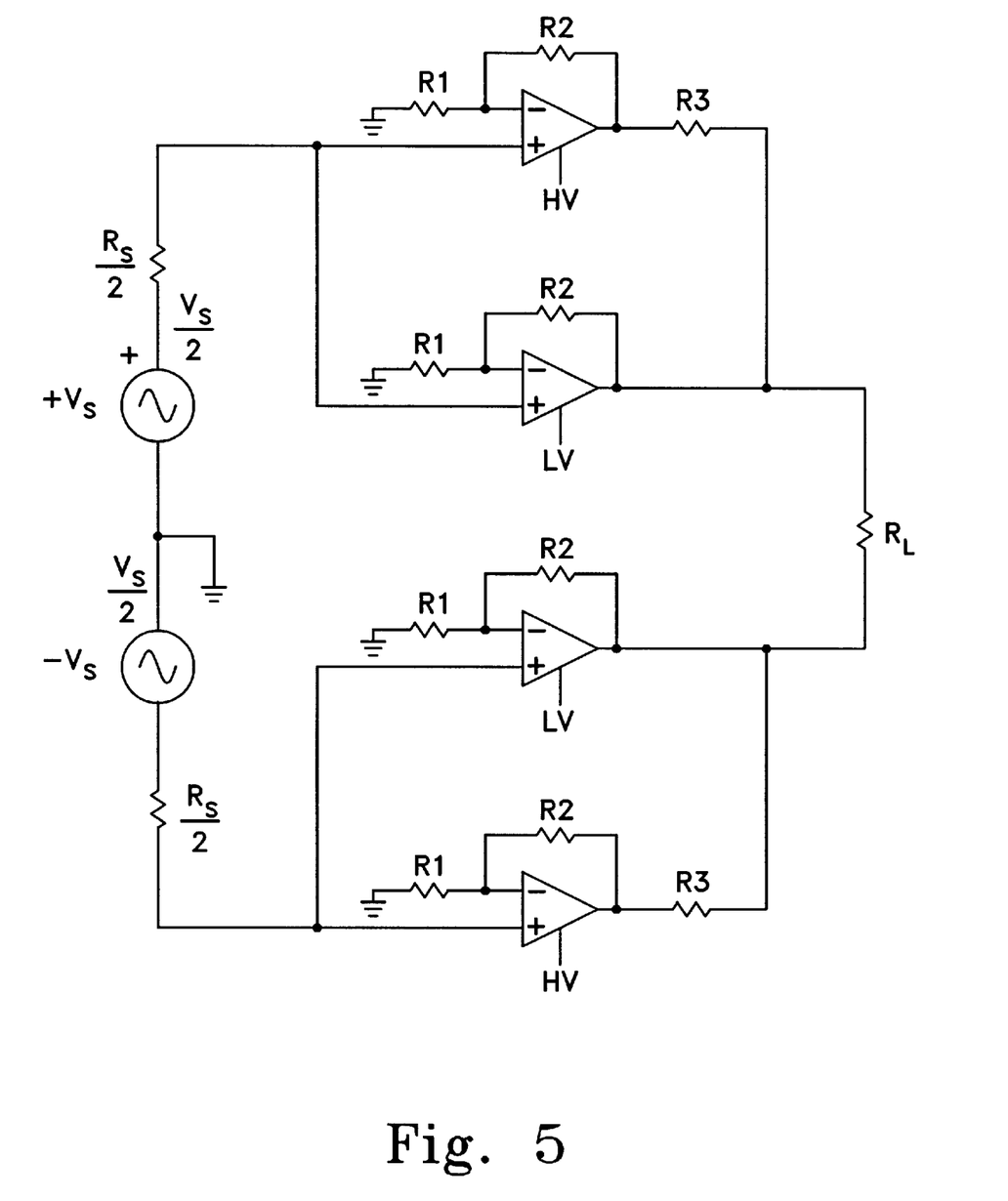
FIG. 5 illustrates a second embodiment of a switchless high efficiency voltage amplifier.

FIG. 5 illustrates a second embodiment which is a differential format of the switchless high efficiency amplifier of the first embodiment. As illustrated in FIG. 5, two voltage supplies are provided, each providing half of the overall supply voltage. A negative voltage supply $-V_s$ has the positive terminal connected to ground so that it is providing only negative potential and a positive voltage supply $+V_s$ has the negative terminal connected to ground so that it is only providing positive potential. The source resistance for each voltage supply is half of the overall source resistance Rs. The positive voltage supply $+V_s$ is connected to a pair of amplifiers, a positive high voltage amplifier +HV and a positive low voltage amplifier +LV. The negative voltage supply $-V_s$ is also connected to a pair of amplifiers, a negative high voltage amplifier −HV and a negative low voltage amplifier −LV. The output of the low voltage amplifiers is connected directed to the load $R_L$, while the output of the high voltage amplifiers is connected to the load $R_L$ via a resistive element R3. The positive amplifiers are connected to one end of the load while the negative amplifiers are connected to the opposite end of the load. Thus, the voltage across the load is defined as the difference between the positive voltage applied to one side of the load $R_L$ and the negative voltage applied to the other side of the load $R_L$. Current I flows through the load $R_L$ from the positive voltage to the negative voltage.

Figure 6A:
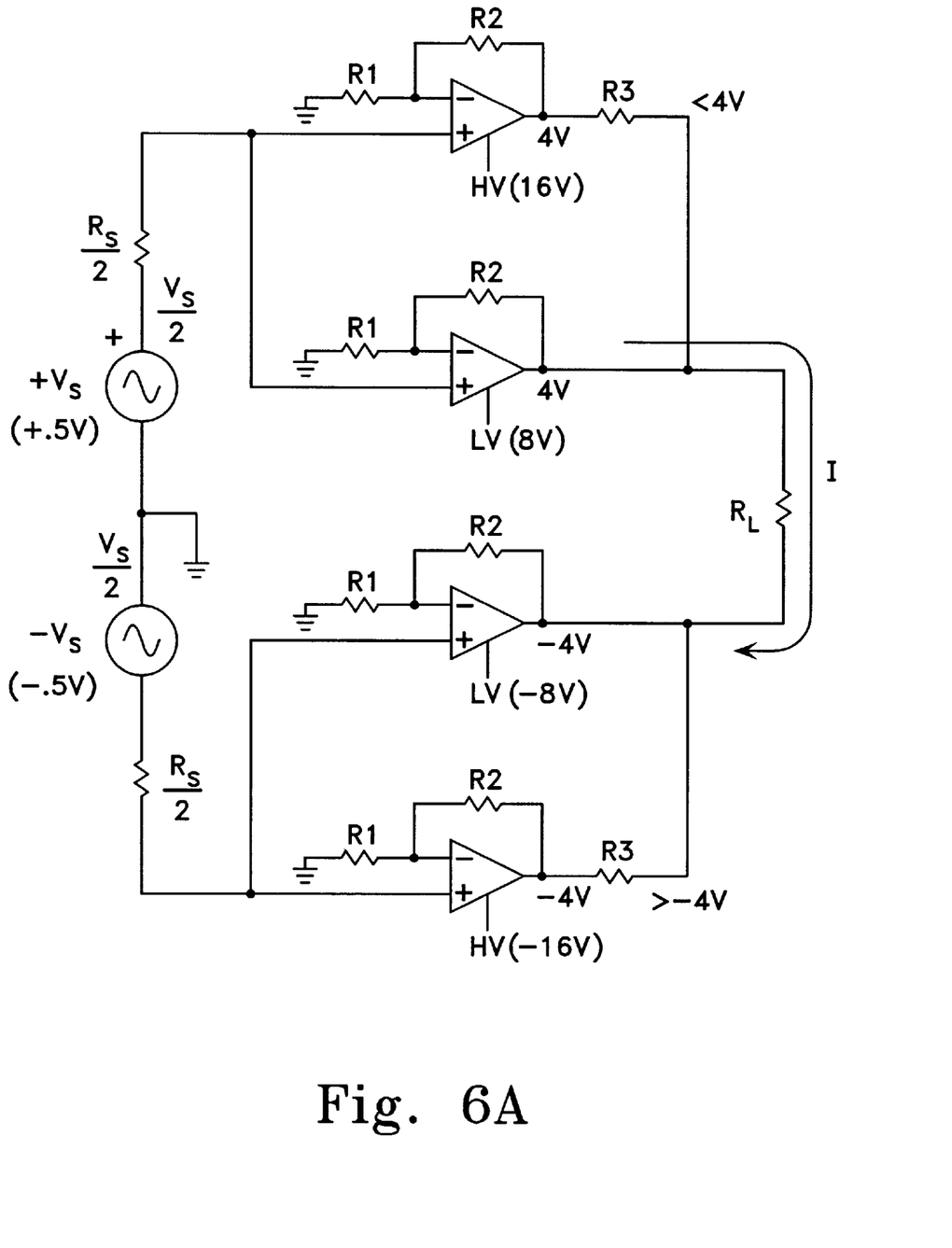
FIG. 6A illustrates the operation of the second embodiment of the switchless high efficiency voltage amplifier for typical inputs.
Figure 6B:
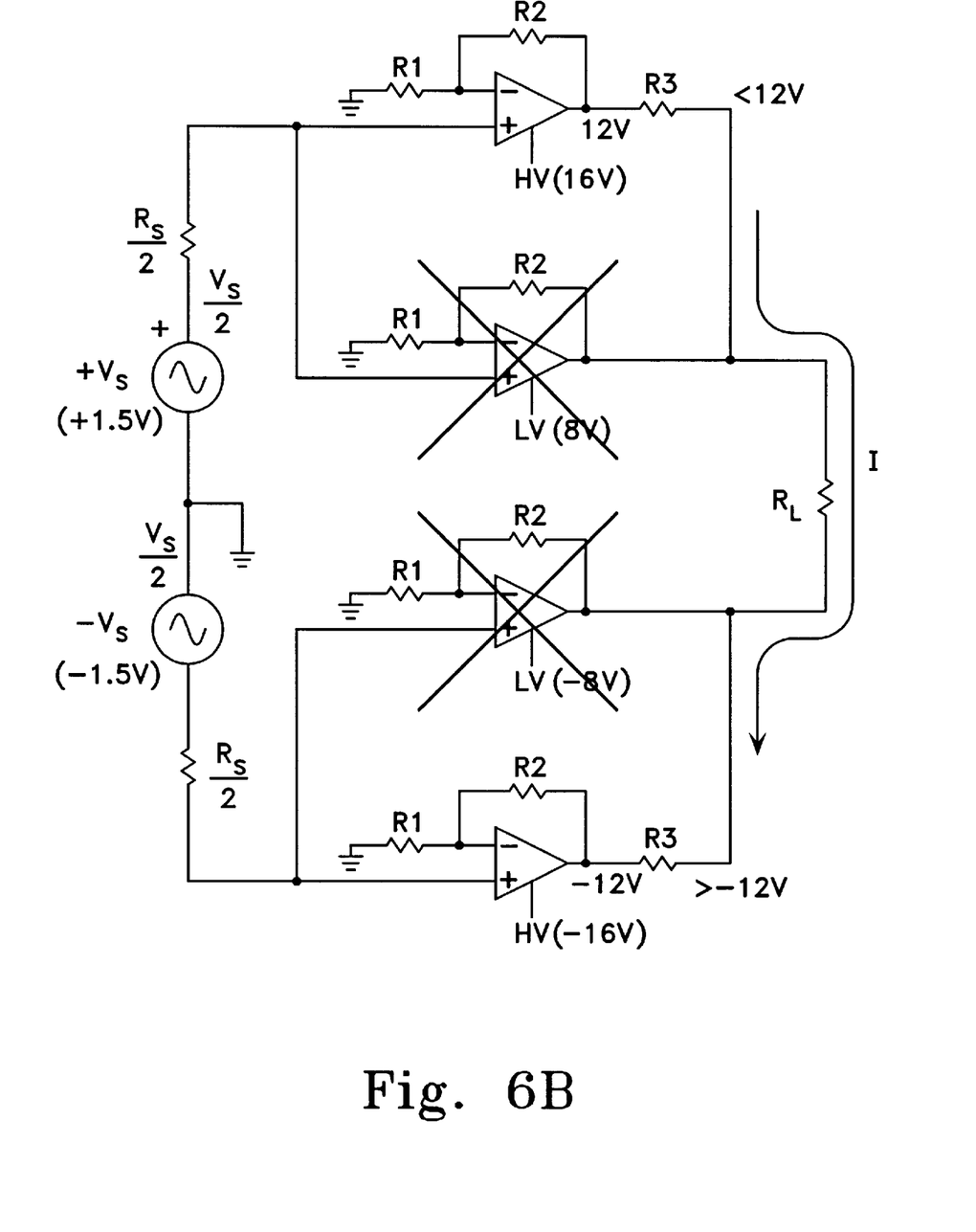
FIG. 6B illustrates the operation of the second embodiment of the switchless high efficiency voltage amplifier for peak inputs.

FIGS. 6A and 6B illustrate how the second embodiment of the inventive amplifier operates using example values. The overall supply voltage can be up to 4V. Therefore, the positive voltage supply $+V_s$ will provide between 0 and 2V and the negative voltage supply $-V_s$ will provide between 0 and −2V. The nominal range of the positive voltage supply is between 0 to 1V and the peak range is between 1 and 2V. The nominal range for the negative voltage supply is between 0 and −1V and the peak range is between −1 and −2V. As with the first embodiment, the gain is eight as defined by resistive elements R1 and R2. The positive low voltage amplifier +LV is supplied with an operating voltage of 8V, the positive high voltage amplifier +HV is provided with an operating voltage of 16V, the negative low voltage amplifier −LV is provided with an operating voltage of −8V, and the negative high voltage amplifier −HV is provided with an operating voltage of −16V.

FIG. 6A illustrates an instant in time when the overall voltage supply $V_s$ is 1V so that the positive power supply +Vs is providing 0.5V and the negative power supply $-V_s$ is providing −0.5V. The two positive voltage amplifiers will produce an output of 4V, and the negative voltage amplifiers will produce an output of −4V. Since, resistive element R3 reduces the absolute output potential of both the positive and negative high voltage amplifiers, the low voltage amplifiers will provide the current I to the load.

FIG. 6B illustrates an instance in time when peak voltages, for example, +1.5V and −1.5V, are provided. The two positive amplifiers produce an output voltage of +12V which is above the limits of the positive low voltage amplifier +LV, therefore the positive low voltage amplifier +LV would become reverse biased and logically disconnected from the load $R_L$. The same result would occur for the two negative amplifiers. Thus, the high voltage amplifiers provide the output voltage, slightly reduced by the resistive element R3, to each end of the load $R_L$. Current I flows through the load $R_L$ from the positive voltage to the negative voltage.

Figure 7:
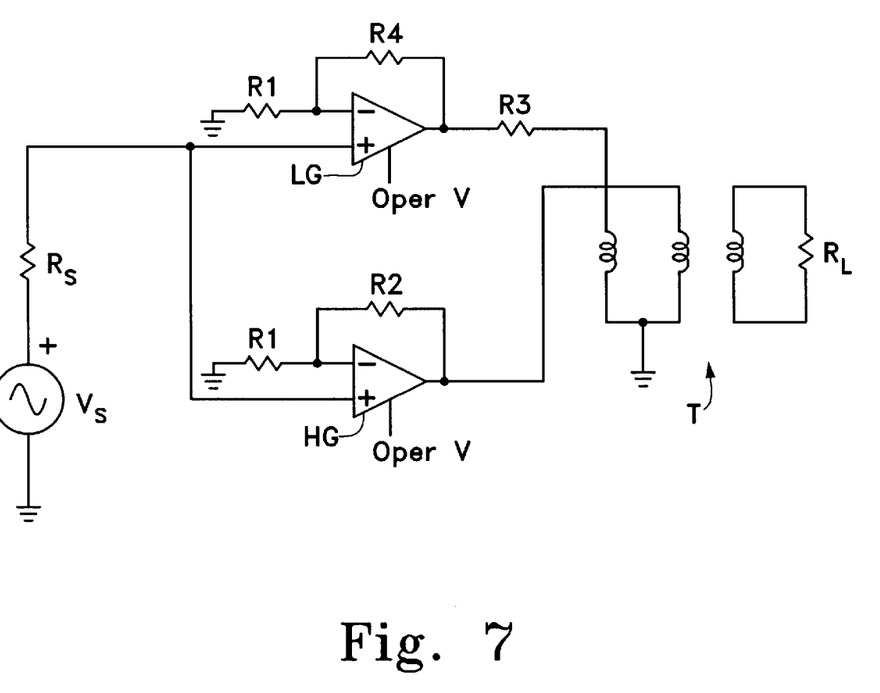
FIG. 7 illustrates a third embodiment of a switchless high efficiency voltage amplifier.

A third preferred embodiment of the switchless high efficiency amplifier only requires one operating voltage. That is, each of the amplifiers has the same operating voltage applied so that each of the amplifiers is capable of providing the same output voltage. However, the gain of each of the amplifiers is different. That is, there is a high gain amplifier HG and a low gain amplifier LG. The output of the high gain amplifier HG is directly connected to a first winding of a transformer T, while the output of the low gain amplifier LG is connected to a second winding of the transformer T through a resistive element R3. The transformer T is designed to equalize the output voltages of the high gain amplifier HG and the low gain amplifier LG. That is, the transformer T has a first winding to second winding ratio that is equal to the ratio of the high gain amplifier HG to low gain amplifier LG. For example, if the ratio of the high gain to the low gain is 4 to 1, the ratio of the first winding to second winding is also 4 to 1 in order to equalize the output voltages. However, as with the first and the second embodiments the resistive element R3 will reduce the output voltage of one amplifier enough to prevent the amplifier from supplying current I through the load $R_L$ while the other amplifier can produce an output voltage corresponding to the input voltage. In this case the resistive element R3 prevents the output voltage of the low gain amplifier LG from being provided to the load $R_L$.

Figure 8A:
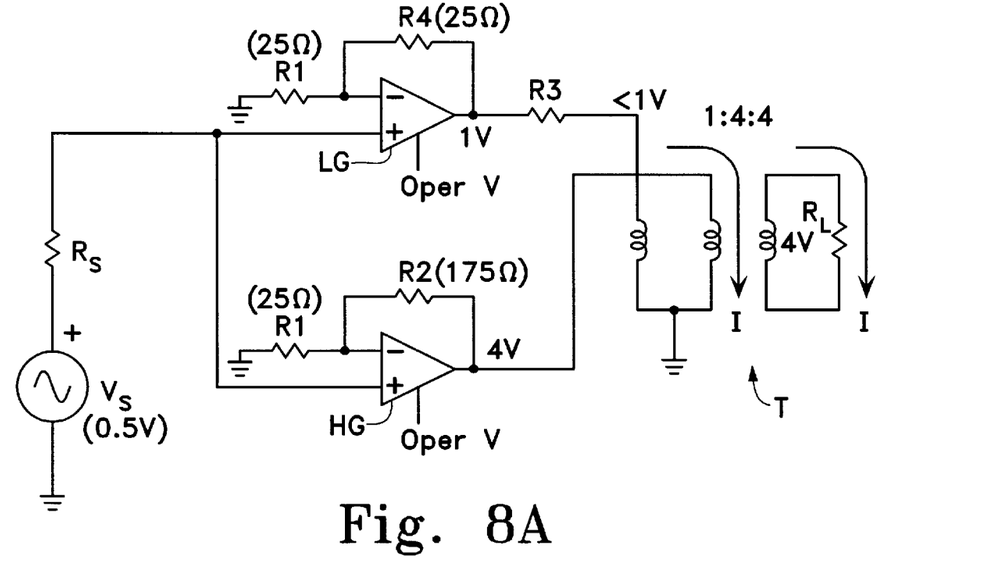
FIG. 8A illustrates the operation of the third embodiment of the switchless high efficiency voltage amplifier for typical inputs.
Figure 8B:
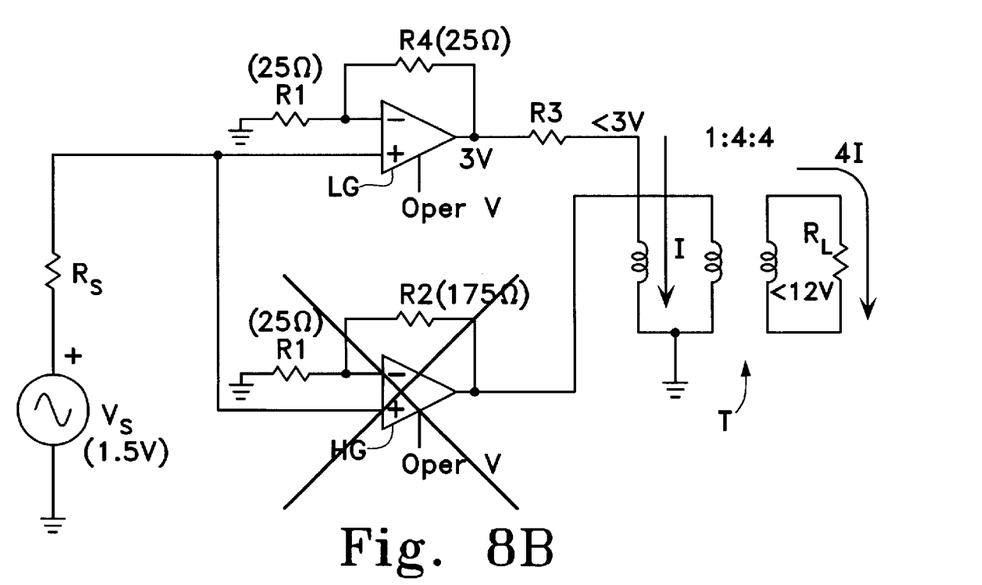
FIG. 8B illustrates the operation of the third embodiment of the switchless high efficiency voltage amplifier for peak inputs.

FIGS. 8A and 8B illustrate how the third embodiment of the inventive amplifier operates using example values. As with the first embodiment the typical input voltage from the voltage supply $V_s$ is between 0 and 1V and the peak voltages are between 1 and 2V. The gain of the high gain amplifier HG remains eight as defined by resistive elements R1 and R2. The gain of the low gain amplifier LG is two as defined by resistive elements R1 and R4. Both amplifiers are supplied with an operating voltage of 8V. The transformer has a turn ratio that increases the output voltage of the low gain by four prior to applying the voltage to the load $R_L$.

FIG. 8A assumes that at an instant in time the voltage supply $V_s$ is supplying 0.5V so that the high gain amplifier HG produces an output of 4V, while the low gain amplifier produces an output of 1V. Since, resistive element R3 reduces the output voltage of the low gain amplifier LG prior to the low gain amplifier voltage being increased four fold by the transformer T, the resistive element R3 effectively blocks current I from flowing to the load $R_L$ from the low gain amplifier LG.

FIG. 8B illustrates a peak voltage of 1.5V being provided by the voltage supply $V_s$. The output of the high gain amplifier HG would be 12V which is above the characteristics of the high gain amplifier HG. Thus, the high gain amplifier HG would become reverse biased and logically disconnected from the load $R_L$. The low gain amplifier LG produces an output voltage of 3V which is well within the limits of the amplifier. Thus, the 3V output, slightly reduced by the resistor R3, will be increased four fold by the transformer T and applied to the load $R_L$.

Although this invention has been illustrated by reference to specific embodiments, it will be apparent to those skilled in the art that various changes and modifications may be made which clearly fall within the scope of the invention. The invention is intended to be protected broadly within the spirit and scope of the appended claims.

What is claimed:

1. A switchless high efficiency amplifier comprising:
    a load;
    a first input supply;
    a first amplifier having a first input connected to the first input supply, a first output connected to a first end of the load, and a first gain defined by a first negative feedback loop;
    a second amplifier having a second input connected to the input supply, a second output connected to a first end of the load via a first resistive element, and a second gain defined by a second negative feedback loop, wherein when the first output and the second output are the same, the first resistive element reduces the second output so that the first output is greater and is therefore provided to the load, further wherein the first gain and the second gain are equal so that the first output and the second output are equal; and a first operational voltage applied to the first amplifier and a second operational voltage greater than the first operational voltage applied to the second amplifier.

2. The switchless high efficiency amplifier of claim 1, wherein the first amplifier can produce the first output up to of the first operational voltage and the second amplifier can produce the second output up to of the second operational voltage.

3. The switchless high efficiency amplifier of claim 1, wherein the first amplifier and the second amplifier do not allow reverse current flow.

4. The switchless high efficiency amplifier of claim 2, wherein when the input supply supplies an input that would produce the first output above the first operational voltage, the first amplifier becomes reverse biased and logically disconnects from the load.

5. The switchless high efficiency amplifier of claim 4, wherein the second amplifier provides the second output to the load when the first amplifier is logically disconnected from the load.

6. The switchless high efficiency amplifier of claim 1, wherein the first resistive element prevents the second amplifier from supplying current inefficiently to the load while the first amplifier is capable of producing the first output in response to an input from the input supply.

7. The switchless high efficiency amplifier of claim 6, wherein the first resistive element provides little impediment to current flow from the second output to the load, when the first amplifier is logically disconnected from the load.

8. The switchless high efficiency amplifier of claim 1, wherein the second gain is reduced by the first resistive element.

9. The switchless high efficiency amplifier of claim 1, wherein the first resistive element is small in comparison to the load.

10. The switchless high efficiency amplifier of claim 1, further comprising:
    a second input supply;
    a third amplifier having a third input connected to the second input supply, a third output connected to a second end of the load, and a third gain defined by a third negative feedback loop;
    a fourth amplifier having a fourth input connected to the second input supply, a fourth output connected to the second end of the load via a second resistive element, and a fourth gain defined by a fourth negative feedback loop, wherein when the third output and the fourth output are the same, the second resistive element reduces an absolute value of the fourth output so that an absolute value of the third output is greater and is therefore applied to the second end of the load; and
    a third operational voltage applied to the third amplifier, and a fourth operational voltage having an absolute value greater than the absolute value of the third operational voltage applied to the fourth amplifier.

11. The switchless high efficiency amplifier of claim 10, wherein the first gain, the second gain, the third gain and the fourth gain are equal so that the first output and the second output are equal and the third output and the fourth output are equal.

12. The switchless high efficiency amplifier of claim 10, wherein when the second input supply supplies an input that would produce the third output above the third operational voltage, the third amplifier becomes reverse biased and logically disconnects from the load.

13. The switchless high efficiency amplifier of claim 1, further compromising
    a first transformer winding having a first number of windings connected to the first output;
    a second transformer winding having a second number of windings connected to the first resistive element; and
    a third transformer winding connected to the load.

14. The switchless high efficiency amplifier of claim 13, further compromising an operational voltage applied to the first amplifier and the second amplifier.

15. The switchless high efficiency amplifier of claim 14, wherein a ratio of the first gain to the second gain is equal to a ratio of the first number of winding to the second number of windings.

16. A switchless high efficiency amplifier comprising:
    a first parallel path including a first voltage amplifier defined by a first gain;
    a second parallel path including a second voltage amplifier defined by a second gain, and a first resistor in series with the second voltage amplifier, wherein the second voltage amplifier has a higher operating voltage than the first voltage amplifier;
    a first voltage supply providing a first supply voltage to the first parallel path and the second parallel path, wherein the first parallel path will have a first output voltage and the second parallel path will have a second output voltage;
    a load having a first end connected to the first output voltage and the second output voltage, and a second end connected to a reference voltage, wherein current will flow through the load from the greater of the first output voltage and the second output voltage to the reference voltage.

17. The switchless high efficiency amplifier of claim 16, wherein the first gain and the second gain are the same.

18. The switchless high efficiency amplifier of claim 17, wherein the first resistor reduces the second gain so that the first output voltage is greater than the second output voltage.

19. A switchless high efficiency amplifier comprising:
    a first parallel path including a first voltage amplifier defined by a first gain;
    a second parallel path including a second voltage amplifier defined by a second gain, and a first resistor in series with the second voltage amplifier;
    a first voltage supply providing a first supply voltage to the first parallel path and the second parallel path, wherein the first parallel path will have a first output voltage and the second parallel path will have a second output voltage;
    a load having a first end connected to the first output voltage and the second output voltage, and a second end connected to a reference voltage, wherein current will flow through the load from the greater of the first output voltage and the second output voltage to the reference voltage, further wherein the first parallel path logically disconnects from the load when the first supply voltage exceeds a certain value.

20. The switchless high efficiency amplifier of claim 16, further comprising:
    a third parallel path including a third voltage amplifier defined by the first gain;
    a fourth parallel path including a fourth voltage amplifier defined by the second gain, and a second resistor in series with the fourth voltage amplifier, wherein the third voltage amplifier and the fourth voltage amplifier are positive voltage amplifiers and the fourth voltage amplifier has a higher operating voltage than the third voltage amplifier; and a second voltage supply providing a second supply voltage to the third parallel path and the fourth parallel path, wherein the third parallel path will have a third output voltage and the fourth parallel path will have a fourth output voltage and the reference voltage is the lessor of the third output voltage and the fourth output voltage.

21. The switchless high efficiency amplifier of claim 20, wherein the first gain and the second gain are the same.

22. The switchless high efficiency amplifier of claim 20, wherein the third voltage amplifier and the fourth voltage amplifier are negative voltage amplifiers and the fourth voltage amplifier has a higher absolute operating voltage than the third voltage amplifier.

23. The switchless high efficiency amplifier of claim 20, wherein the absolute operating voltages of the first voltage amplifier and the third voltage amplifier are the same and the absolute operating voltages of the second voltage amplifier and the fourth voltage amplifier are the same and are higher than the absolute operating voltages of the first voltage amplifier and the third voltage amplifier.

24. The switchless high efficiency amplifier of claim 16, wherein the first parallel path further includes a first transformer winding having a first number of windings and the second parallel path further includes a second transformer winding having a second number of windings, and the load is connected to a third transformer winding magnetically connected to the first transformer winding and the second transformer winding.

25. The switchless high efficiency amplifier of claim 24, wherein the first voltage amplifier and the second voltage amplifier have identical operating voltages.

26. The switchless high efficiency amplifier of claim 24, wherein the first gain is greater than the second gain.

27. The switchless high efficiency amplifier of claim 24, wherein the first number of windings is greater than the second number of windings.

28. The switchless high efficiency amplifier of claim 24, wherein a ratio of the first gain to the second gain is equal to a ratio of the first number of windings to the second number of windings.

29. A method for operating amplifiers that can handle peak inputs at a high efficiency, the method comprising:

supplying a first input to a first amplifier and a second amplifier;

producing a first output from the first amplifier;

producing a second output from the second amplifier and reducing the second output by passing it through a first resistive element to produce a third output;

providing the greater of the first output and the third output to a load; and flowing current to the load, wherein the current is generated from the greater of the first output and the third output.

30. The method of claim 29, wherein the first amplifier and the second amplifier have identical gains so that the first output and the second output are identical.

31. The method of claim 29, wherein the input, the first output, the second output and the third output are voltages.

32. The method of claim 31, wherein the first resistive element is a resistor and the second output voltage drops across the resistor.

33. A method for operating amplifiers that can handle peak inputs at a high efficiency, the method comprising:

supplying a first input to a first amplifier and a second amplifier, wherein the first amplifier is a low voltage amplifier and the second amplifier is a high voltage amplifier;

producing a first output from the first amplifier;

producing a second output from the second amplifier and reducing the second output by passing it through a first resistive element to produce a third output; and providing the greater of the first output and the third output to a load.

34. The method of claim 33, further comprising logically disconnecting the low voltage amplifier from the load when the first input exceeds a certain value.

35. The method of claim 29, wherein the first input is a positive voltage, the first amplifier is a positive low voltage amplifier and the second amplifier is a positive high voltage amplifier, the method further comprising supplying a negative voltage to a negative low voltage amplifier and a negative high voltage amplifier;

producing a fourth output voltage from the negative low voltage amplifier;

producing a fifth output voltage from the negative high voltage amplifier and providing the fifth output voltage to a second resistor, wherein the fifth output voltage drops across the second resistor to produce a sixth output voltage; and flowing current through the load from the greater of the first output voltage and the third output voltage to the greater of the absolute value of the fourth output voltage and the sixth output voltage.

36. The method of claim 35, wherein the positive low voltage amplifier, the positive high voltage amplifier, the negative low voltage amplifier and the negative high voltage amplifier all have an identical gain.

37. The method of claim 35, further comprising logically disconnecting the positive low voltage amplifier from the load when the positive voltage exceeds a first value and logically disconnecting the negative low voltage amplifier from the load when the negative voltage exceeds a second value.

38. The method of claim 29, wherein the gain of the first amplifier is greater that the gain of the second amplifier.

39. The method of claim 38, wherein the providing the greater of first output and the third output includes providing the first output to a first winding of a transformer;

providing the third output to a second winding of the transformer, wherein current will flow through the first winding if the first output is greater than the third output, and current will flow through the second winding if the third output is greater than the first output; and providing a voltage across a third winding of the transformer, wherein the voltage corresponds to the greater of the first output and the third output.

40. The method of claim 39, wherein the transformer has a first winding to second winding ratio that is equal to a ratio of a gain of the first amplifier to a gain of the second amplifier.

41. A switchless high efficiency amplifier comprising;

an input supply;

a node;

a first parallel path from the input supply to the node which includes a first amplifier defined by a first gain and a first winding of a transformer in series with the first amplifier;

a second parallel path from the input supply to the node which includes a second amplifier defined by a second gain, a resistor, and a second winding of the transformer, the second amplifier, the resistor and the second winding being in series with each other;

a third winding of the transformer magnetically connected to the first winding and the second winding; and a load coupled to the third winding.

42. The switchless high efficiency amplifier of claim 41, wherein the node is ground.

43. The switchless high efficiency amplifier of claim 41, wherein the ratio of the first winding to the second winding is the same as the ratio of the first gain to the second gain.

44. The switchless high efficiency amplifier of claim 41, wherein the operating range of the first amplifier and the second amplifier is the same.

\* \* \* \* \*